US007618836B2

(12) United States Patent
Sakaino

(10) Patent No.: US 7,618,836 B2
(45) Date of Patent: Nov. 17, 2009

(54) METHOD FOR MANUFACTURING SEMICONDUCTOR OPTICAL DEVICE

(75) Inventor: Go Sakaino, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 89 days.

(21) Appl. No.: 12/113,299

(22) Filed: May 1, 2008

(65) Prior Publication Data

US 2009/0197363 A1 Aug. 6, 2009

(30) Foreign Application Priority Data

Jan. 31, 2008 (JP) ............... 2008-021581

(51) Int. Cl.
*H01L 21/00* (2006.01)
(52) U.S. Cl. ............... 438/44; 438/41; 438/42; 257/E21.238; 257/E21.461; 257/E21.326
(58) Field of Classification Search ........... 438/41, 438/42, 44; 257/E21.219, E21.22, E21.222, 257/E21.238, E21.322, E21.461
See application file for complete search history.

(56) References Cited

U.S. PATENT DOCUMENTS 5,490,159 A * 2/1996 Ochi et al. ............... 372/43.01
5,629,232 A * 5/1997 Jiang ..................... 438/40
5,717,710 A * 2/1998 Miyazaki et al. ......... 372/50.11
6,358,316 B1 3/2002 Kizuki et al.
6,821,801 B1 11/2004 Sato et al.
2005/0185909 A1* 8/2005 Bour et al. ................. 385/131

FOREIGN PATENT DOCUMENTS

JP 01-305586 12/1989
JP 2001-053391 2/2001

* cited by examiner

*Primary Examiner*—Caridad M Everhart
(74) *Attorney, Agent, or Firm*—Leydig, Voit & Mayer, Ltd.

(57) ABSTRACT

A method for manufacturing a semiconductor optical device comprises: forming a groove on a first semiconductor layer; forming a second semiconductor layer containing aluminum in the groove; forming a third semiconductor layer on the first semiconductor layer and the second semiconductor layer; forming an insulating layer on the third semiconductor layer covering the region opposite the second semiconductor layer; forming a stripe-shaped structure by etching the first semiconductor layer and the third semiconductor layer without exposing the second semiconductor layer, using the insulating layer as a mask; and burying the stripe-shaped structure with burying layers.

2 Claims, 12 Drawing Sheets

METHOD FOR MANUFACTURING SEMICONDUCTOR OPTICAL DEVICE

BACKGROUND OF THE INVENTION

1. Field of the Invention

The present invention relates to a method for manufacturing a buried semiconductor optical device having a semiconductor layer containing elemental aluminum, and more specifically, to a method for manufacturing a semiconductor optical device that can ensure favorable characteristics and high reliability.

2. Background Art

A buried semiconductor optical device wherein a semiconductor laminated structure is etched using a mask to form a striped structure, and the striped structure is buried by burying layers, has been proposed (for example, refer to Japanese Patent Application Laid-Open No. 2001-53391).

SUMMARY OF THE INVENTION

A manufacturing method for a buried semiconductor optical device according to the first reference example will be described. First, as shown in FIG. 31, a p-type InP clad layer 12, an active layer 15 containing elemental aluminum, and an n-type InP clad layer 16 are formed in this order on a p-type InP substrate 11. Then, on the n-type InP clad layer 16, an insulating film 17 patterned using photolithography is formed.

Next, as shown in FIG. 32, the n-type InP clad layer 16 and the active layer 15 are etched using the insulating film 17 as a mask to form a striped structure 18. Then, in a crystal growing apparatus for forming burying layers, the striped structure 18 is etched using a gas or the like containing a halogen element as shown in FIG. 33.

Next, as shown in FIG. 34, the striped structure 18 is buried with a p-type InP burying layer 19, an n-type InP burying layer 20, and a p-type InP burying layer 21. Then, as shown in FIG. 35, the insulating film 17 is removed, and an n-type InP layer 22, an insulating film 23, a surface electrode 24, and a back face electrode 25 are formed.

In the first reference example, the active layer 15 containing elemental aluminum is exposed to gases, such as oxygen, or to atmosphere containing impurities at the sidewalls of the striped structure 18. Therefore, impurities are attached to the surface of the active layer 15, and reaction products or Al oxides are formed. These compounds inhibit the subsequent crystal growth for burying layers. In addition, since ineffective current or the loss of light beams is increased by these compounds, the initial properties and long-term reliability of semiconductor optical devices are deteriorated. Therefore, the striped structure 18 is etched using a halogen-containing gas or the like. However, since the Al oxides or the like formed on the surface of the striped structure 18 are extremely rigid, they cannot be stably removed.

A manufacturing method for solving such problems according to the second reference example will be described. First, as shown in FIG. 36, a p-type InP clad layer 12, an active layer 15 containing elemental aluminum, and an n-type InP clad layer 16 are formed in this order on a p-type InP substrate 11. Then, on the n-type InP clad layer 16, an insulating film 17 patterned using photolithography is formed.

Next, in a crystal growing apparatus for forming burying layers, as shown in FIG. 37, the n-type InP clad layer 16 and the active layer 15 are etched using the insulating film 17 as a mask to form a striped structure 18. Thereafter, as shown in FIG. 38, the striped structure 18 is buried with a p-type InP burying layer 19, an n-type InP burying layer 20, and a p-type InP burying layer 21. Then, as shown in FIG. 39, the insulating film 17 is removed, and an n-type InP layer 22, an insulating film 23, a surface electrode 24, and a back face electrode 25 are formed.

By thus forming the striped structure 18 only by etching in the crystal growing apparatus for forming burying layers, the striped structure 18 is not exposed to gases, such as oxygen, or to atmosphere containing impurities. However, since the sidewalls of the striped structure 18 have a gradient of 45 degrees, the top of the stripe is thinned, and the resistance of the device is increased. To solve these problems, if the n-type InP clad layer 16 is thinned to ensure the width of the top of the stripe, the light confinement layer cannot be sufficiently secured. Alternatively, if the width of the active layer 15 is enlarged to ensure the width of the top of the stripe, the laser oscillation in the basic mode becomes unstable. In addition, etching for a long time is required, and favorable etching properties become difficult to obtain.

As described above, by either method in reference example 1 or 2, the favorable characteristics and high reliability of semiconductor optical devices could not be ensured.

To solve the above-described problems, it is an object of the present invention to provide a method for manufacturing a semiconductor optical device that can ensure favorable characteristics and high reliability.

According to one aspect of the present invention, a method for manufacturing a semiconductor optical device comprises the steps of: forming a groove on a first semiconductor layer; forming a second semiconductor layer containing elemental aluminum in said groove; forming a third semiconductor layer on said first semiconductor layer and said second semiconductor layer; forming an insulating layer on said third semiconductor layer so as to cover the portion above said second semiconductor layer; forming a striped structure by etching said first semiconductor layer and said third semiconductor layer without exposing said second semiconductor layer using said insulating layer as a mask; and burying said striped structure with burying layers.

According to the present invention, the favorable characteristics and high reliability of a semiconductor optical device can be ensured.

Other and further objects, features and advantages of the invention will appear more fully from the following description.

DETAILED DESCRIPTION OF THE PREFERRED EMBODIMENTS

First Embodiment

Figure 1:
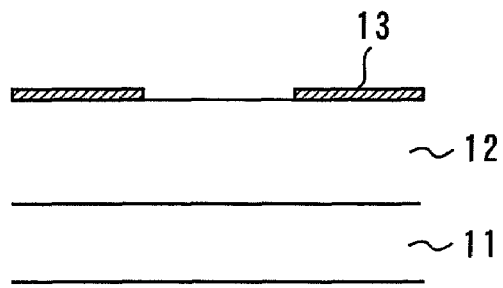
FIGS. 1-8 are sectional views for explaining a method for manufacturing a buried semiconductor optical device according to First Embodiment of the present invention.

A method for manufacturing a semiconductor optical device according to the first embodiment of the present invention will be described referring to the drawings. Here, the case of a semiconductor laser will be described as an example of semiconductor optical devices.

First, as shown in FIG. 1, a p-type InP clad layer 12 (first semiconductor layer) is formed on a p-type InP substrate 11. Then, an insulating film 13, such as an $SiO_2$ film and an SiN film, patterned by photolithography is formed on the p-type InP clad layer 12.

Figure 2:
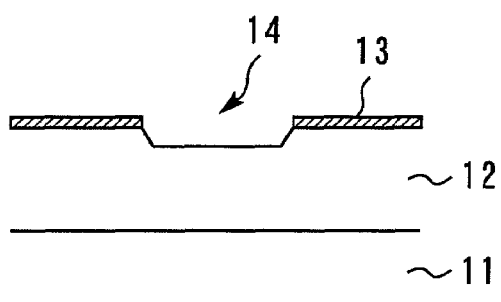

Next, as shown in FIG. 2, the p-type InP clad layer 12 is etched using the insulating film 13 as a mask to form a groove 14. For the etching, wet etching using a chemical solution or dry etching using a gas containing halogen gas, such as HCl, is used. As the width of the groove 14, a value to satisfy cutoff conditions is selected so that the completed semiconductor laser oscillates in a basic mode. Specifically, the width is about 1.0 to 2.0 μm.

Figure 3:
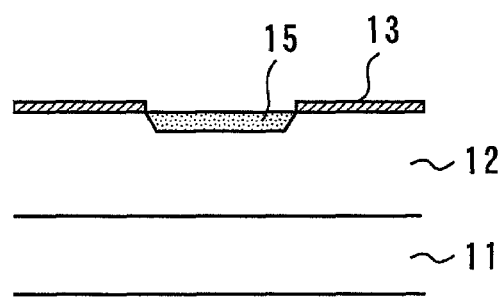

Next, as shown in FIG. 3, an active layer 15 (second semiconductor layer) of an AlGaInAs quantum well containing elemental aluminum is formed in the groove 14. The outermost surface of the active layer 15 is formed of an InP layer containing no aluminum.

Figure 4:
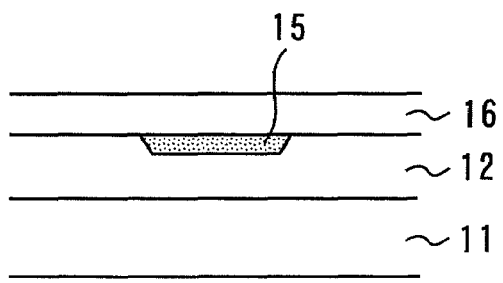

Next, as shown in FIG. 4, the insulating film 13 is removed. Then, an n-type InP clad layer 16 (third semiconductor layer) is formed on the p-type InP clad layer 12 and the active layer 15.

Figure 5:
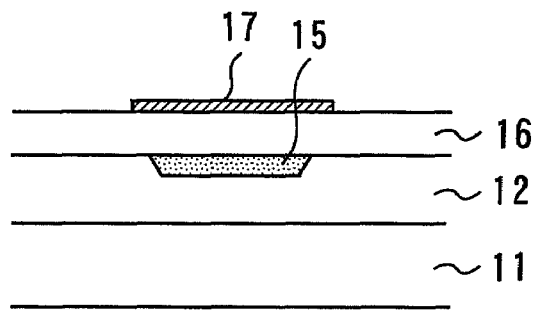

Next, as shown in FIG. 5, an insulating film 17, such as an $SiO_2$ film and an SiN film, patterned by photolithography is formed on the n-type InP clad layer 16 so as to cover the portion above the active layer 15. Although the width of the insulating film 17 is made to be larger than the width of the active layer 15, a value is selected so that the characteristics of the completed semiconductor laser are not lowered by leakage current. Specifically, the width is about 0.2 to 1.0 μm wider than the width of the active layer 15.

Figure 6:
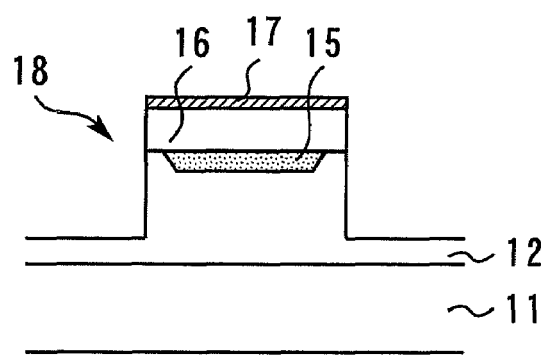

Next, as shown in FIG. 6, the n-type InP clad layer 16 and the p-type InP clad layer 12 on the sides of the active layer 15 are etched so as not to expose the active layer 15 using the insulating film 17 as a mask to form a striped structure 18. For the etching, wet etching using a chemical solution or dry etching using a gas other than halogen-containing gas, such as HCl, is used.

Figure 7:
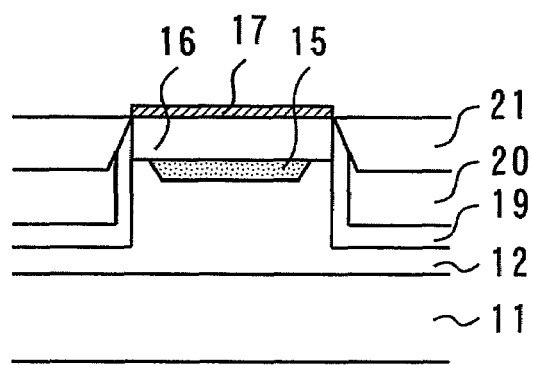

Next, as shown in FIG. 7, the striped structure 18 is buried with a p-type InP burying layer 19, an n-type InP burying layer 20, and a p-type InP burying layer 21. These layers are burying layers for confining current in a completed semiconductor laser.

Figure 8:
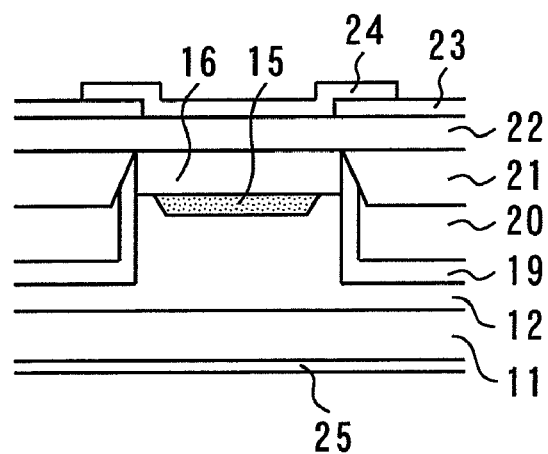

Next, as shown in FIG. 8, the insulating film 17 is removed. Then, an n-type InP layer 22 for forming an electrode is formed. On the n-type InP layer 22, an insulating film 23 of $SiO_2$, SiN or the like for injecting current, and a surface electrode 24 of Ti, Pt, Au, AuGe, AuZn or the like are formed. The back face of the p-type InP substrate 11 is ground to a thickness of about 100 μm to form a back face electrode 25 on the back face of the p-type InP substrate 11. Thereafter, the semiconductor laser is cut to a desired length by cleavage or the like, and a reflective film of $Al_2O_3$, α-Si, or $SiO_2$ is formed on the end surfaces to obtain a desired reflectance. By the above-described steps, the semiconductor optical device according to the first embodiment is manufactured.

As described above, since the active layer 15 in not exposed when the striped structure 18 is formed, the active layer 15 containing elemental aluminum is not exposed to the external air and chemical solutions. Therefore, the favorable characteristics and high reliability of semiconductor optical devices can be ensured.

Second Embodiment

A method for manufacturing a semiconductor optical device according to the second embodiment of the present invention will be described referring to the drawings. Here, the case of a semiconductor laser will be described as an example of semiconductor optical devices.

Figure 9:
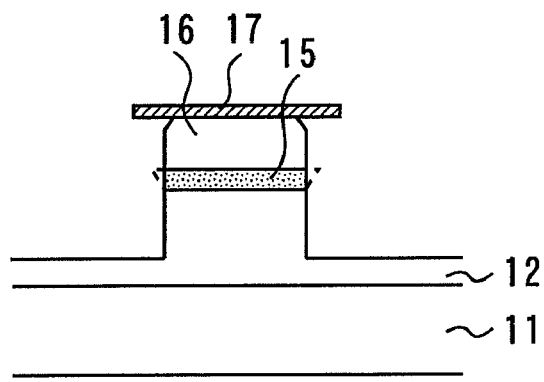
FIGS. 9-11 are sectional views for explaining a method for manufacturing a buried semiconductor optical device according to Second Embodiment of the present invention.

First, in the same manner as in the first embodiment, steps shown in FIGS. 1 to 6 are carried out. Next, as shown in FIG. 9, in a crystal growing apparatus for forming burying layers, the p-type InP clad layer 12 that covers the sides of the active layer 15 is removed by dry etching using a halogen-containing gas, such as HCl, to expose the sides of the active layer 15. At this time, it is preferable to etch also a part of the sides of the active layer 15.

Figure 10:
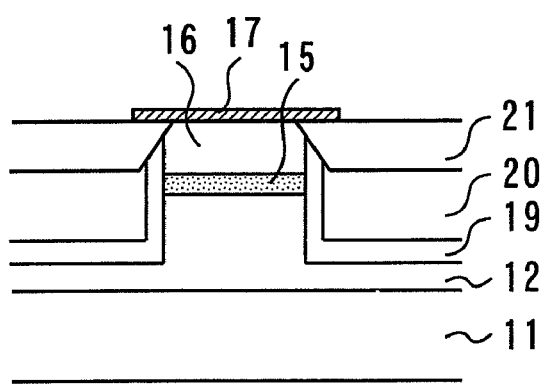
Figure 11:
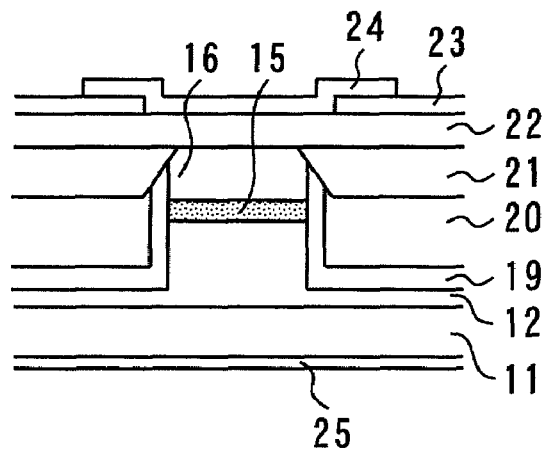

Next, as shown in FIG. 10, the striped structure 18 is buried with a p-type InP burying layer 19, an n-type InP burying layer 20, and a p-type InP burying layer 21. Then, as shown in FIG. 11, the insulating film 17 is removed, and an n-type InP layer 22, an insulating film 23, a surface electrode 24, and a back face electrode 25 are formed.

By exposing the sides of the active layer 15 as described above, leakage current that lowers characteristics can be more reduced than the first embodiment. Furthermore, by etching to a part of the sides of the active layer 15, even if a site to cause the loss of light or carriers is present in the sides of the active layer 15 when the active layer 15 is grown, the site can be removed. Also since etching is carried out in a crystal growing apparatus for forming burying layers, the active layer 15 containing elemental aluminum is not exposed to the external air and chemical solutions.

Third Embodiment

A method for manufacturing a semiconductor optical device according to the third embodiment of the present invention will be described referring to the drawings. The present embodiment is an embodiment wherein the first embodiment is applied to a distributed feedback semiconductor laser (DFB-LD) having a diffraction grating formed on an active layer.

Figure 12:
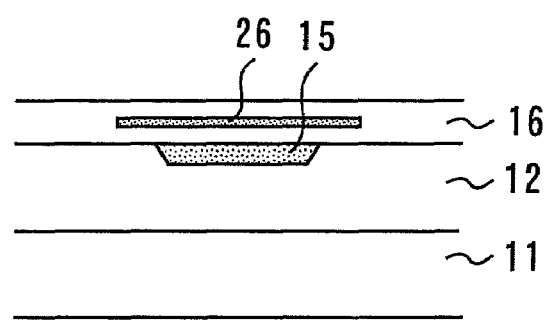
FIGS. 12-16 are sectional views for explaining a method for manufacturing a buried semiconductor optical device according to Third Embodiment of the present invention.

First, in the same manner as in the first embodiment, steps shown in FIGS. 1 to 3 are carried out. Next, as shown in FIG. 12, the insulating film 13 is removed. Then, an n-type InP clad layer 16 (third semiconductor layer) is formed on the p-type InP clad layer 12 and the active layer 15. Then, a diffraction grating 26 is formed in the n-type InP clad layer 16 by a step wherein heretofore known crystal growth and photoengraving are combined.

Figure 13:
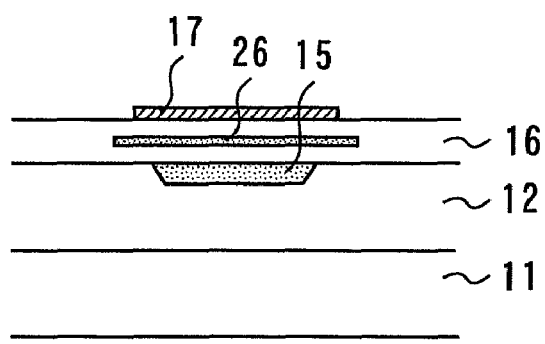

Next, as shown in FIG. 13, an insulating film 17, such as an $SiO_2$ film and an SiN film, patterned by photolithography is formed on the n-type InP clad layer 16 so as to cover the portion above the active layer 15. Although the width of the insulating film 17 is made to be larger than the width of the active layer 15, a value is selected so that the characteristics of the completed semiconductor laser are not lowered by leakage current. Specifically, the width is about 0.2 to 1.0 μm wider than the width of the active layer 15.

Figure 14:
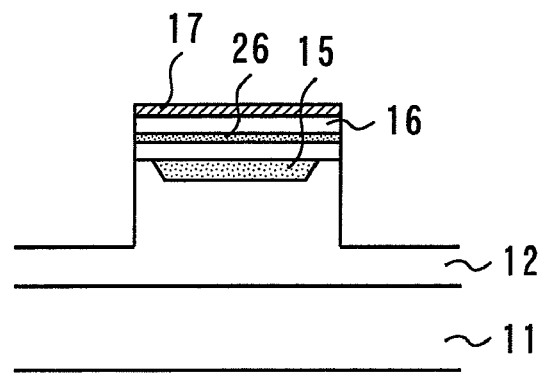

Next, as shown in FIG. 14, the n-type InP clad layer 16 and the p-type InP clad layer 12 on the sides of the active layer 15 are etched so as not to expose the active layer 15 using the insulating film 17 as a mask to form a striped structure 18. For the etching, wet etching using a chemical solution or dry etching using a gas other than halogen-containing gas, such as HCl, is used.

Figure 15:
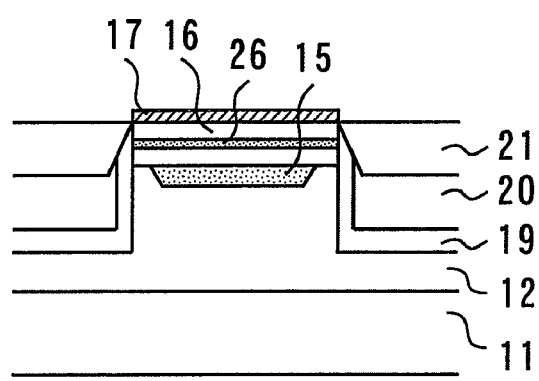
Figure 16:
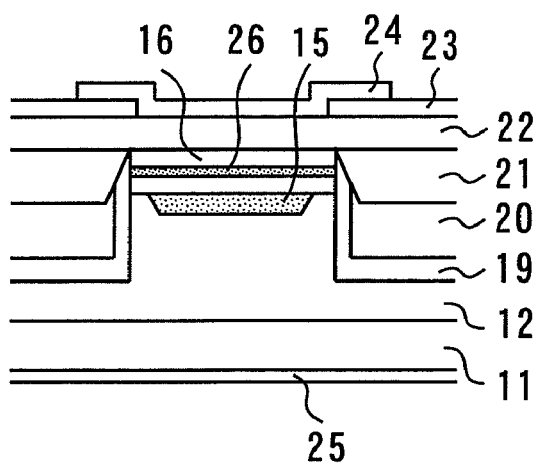

Next, as shown in FIG. 15, the striped structure 18 is buried with a p-type InP burying layer 19, an n-type InP burying layer 20, and a p-type InP burying layer 21. Then, as shown in FIG. 16, the insulating film 17 is removed, and an n-type InP layer 22, an insulating film 23, a surface electrode 24, and a back face electrode 25 are formed.

As described above, since the third embodiment is identical to the first embodiment except that the diffraction grating 26 is formed above the active layer 15, an equivalent effect as in the first embodiment can be achieved.

Fourth Embodiment

A method for manufacturing a semiconductor optical device according to the fourth embodiment of the present invention will be described referring to the drawings. The present embodiment is an embodiment wherein the second embodiment is applied to a distributed feedback semiconductor laser (DFB-LD) having a diffraction grating formed on an active layer.

First, in the same manner as in the first embodiment, steps shown in FIGS. 1 to 3 are carried out; and in the same manner as in the third embodiment, steps shown in FIGS. 12 to 14 are carried out.

Figure 17:
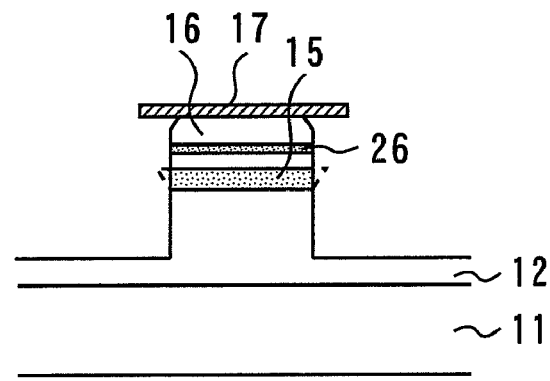
FIGS. 17-19 are sectional views for explaining a method for manufacturing a buried semiconductor optical device according to Fourth Embodiment of the present invention.

Next, as shown in FIG. 17, in a crystal growing apparatus for forming burying layers, the p-type InP clad layer 12 that covers the sides of the active layer 15 is removed by dry etching using a halogen-containing gas, such as HCl, to expose the sides of the active layer 15. At this time, it is preferable to etch also a part of the sides of the active layer 15.

Figure 18:
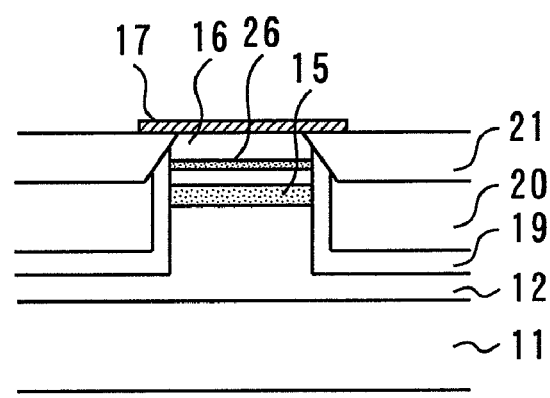
Figure 19:
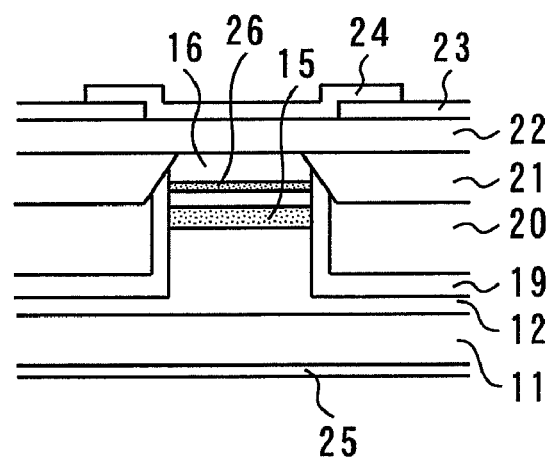

Next, as shown in FIG. 18, the striped structure 18 is buried with a p-type InP burying layer 19, an n-type InP burying layer 20, and a p-type InP burying layer 21. Then, as shown in FIG. 19, the insulating film 17 is removed, and an n-type InP layer 22, an insulating film 23, a surface electrode 24, and a back face electrode 25 are formed.

As described above, since the fourth embodiment is identical to the second embodiment except that the diffraction grating 26 is formed above the active layer 15, an equivalent effect as in the second embodiment can be achieved.

Fifth Embodiment

A method for manufacturing a semiconductor optical device according to the fifth embodiment of the present invention will be described referring to the drawings. The present embodiment is an embodiment wherein the first embodiment is applied to a distributed feedback semiconductor laser (DFB-LD) having a diffraction grating formed under an active layer.

Figure 20:
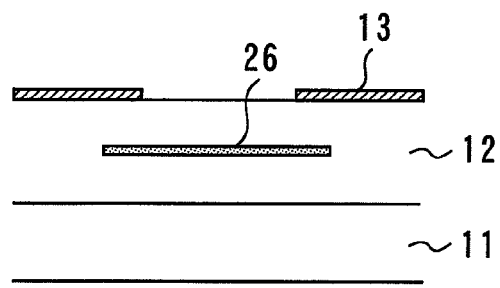
FIGS. 20-27 are sectional views for explaining a method for manufacturing a buried semiconductor optical device according to Fifth Embodiment of the present invention.

First, as shown in FIG. 20, a p-type InP clad layer 12 (first semiconductor layer) is formed on a p-type InP substrate 11. Then, a diffraction grating 26 is formed in the n-type InP clad layer 16 by a step wherein heretofore known crystal growth and photoengraving are combined. Furthermore, an insulating film 13, such as an SiO$_2$ film and an SiN film, patterned by photolithography is formed on the p-type InP clad layer 12.

Figure 21:
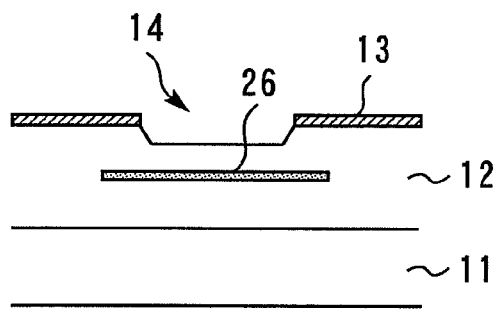

Next, as shown in FIG. 21, the p-type InP clad layer 12 is etched using the insulating film 13 as a mask to form a groove 14. For the etching, wet etching using a chemical solution or dry etching using a gas containing halogen gas, such as HCl, is used. As the width of the groove 14, a value to satisfy cutoff conditions is selected so that the completed semiconductor laser oscillates in a basic mode. Specifically, the width is about 1.0 to 2.0 μm.

Figure 22:
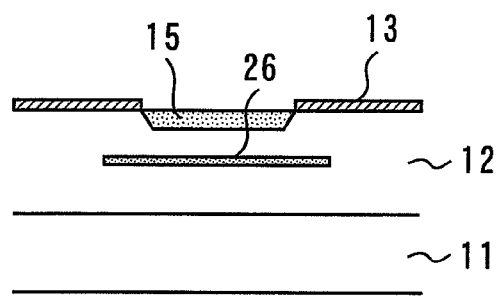

Next, as shown in FIG. 22, an active layer 15 (second semiconductor layer) of an AlGaInAs quantum well containing elemental aluminum is formed in the groove 14. The outermost surface of the active layer 15 is formed of an InP layer containing no aluminum.

Figure 23:
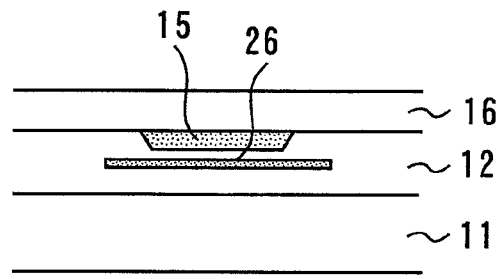

Next, as shown in FIG. 23, the insulating film 13 is removed. Then, an n-type InP clad layer 16 (third semiconductor layer) is formed on the p-type InP clad layer 12 and the active layer 15.

Figure 24:
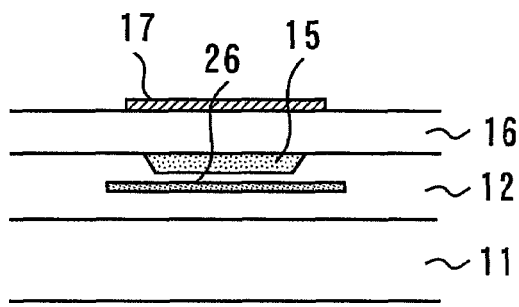

Next, as shown in FIG. 24, an insulating film 17, such as an SiO$_2$ film and an SiN film, patterned by photolithography is formed on the n-type InP clad layer 16 so as to cover the portion above the active layer 15. Although the width of the insulating film 17 is made to be larger than the width of the active layer 15, a value is selected so that the characteristics of the completed semiconductor laser are not lowered by leakage current. Specifically, the width is about 0.2 to 1.0 μm wider than the width of the active layer 15.

Figure 25:
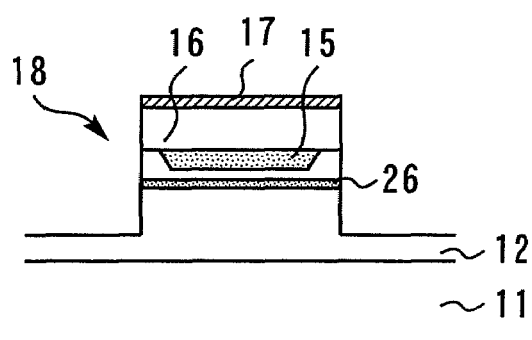

Next, as shown in FIG. 25, the n-type InP clad layer 16 and the p-type InP clad layer 12 on the sides of the active layer 15 are etched so as not to expose the active layer 15 using the insulating film 17 as a mask to form a striped structure 18. For the etching, wet etching using a chemical solution or dry etching using a gas other than halogen gas, such as HCl, is used.

Figure 26:
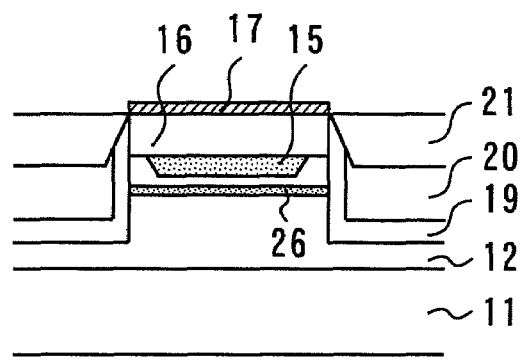
Figure 27:
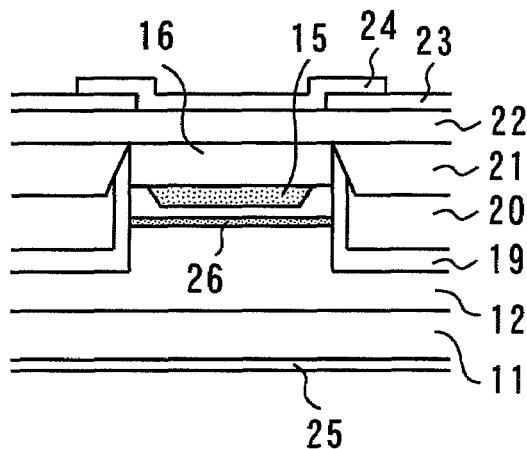

Next, as shown in FIG. 26, the striped structure 18 is buried with a p-type InP burying layer 19, an n-type InP burying layer 20, and a p-type InP burying layer 21. Then, as shown in FIG. 27, the insulating film 17 is removed, and an n-type InP layer 22, an insulating film 23, a surface electrode 24, and a back face electrode 25 are formed.

As described above, since the fifth embodiment is identical to the first embodiment except that the diffraction grating 26 is formed under the active layer 15, an equivalent effect as in the first embodiment can be achieved.

Sixth Embodiment

A method for manufacturing a semiconductor optical device according to the sixth embodiment of the present invention will be described referring to the drawings. The present embodiment is an embodiment wherein the second embodiment is applied to a distributed feedback semiconductor laser (DFB-LD) having a diffraction grating formed under an active layer.

Figure 28:
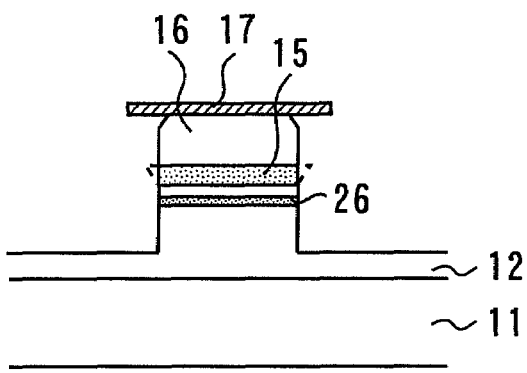
FIGS. 28-30 are sectional views for explaining a method for manufacturing a buried semiconductor optical device according to Sixth Embodiment of the present invention.

First, in the same manner as in the fifth embodiment, steps shown in FIGS. 20 to 25 are carried out. Next, as shown in FIG. 28, in a crystal growing apparatus for forming burying layers, the p-type InP clad layer 12 that covers the sides of the active layer 15 is removed by dry etching using a halogen-containing gas, such as HCl, to expose the sides of the active layer 15. At this time, it is preferable to etch also a part of the sides of the active layer 15.

Figure 29:
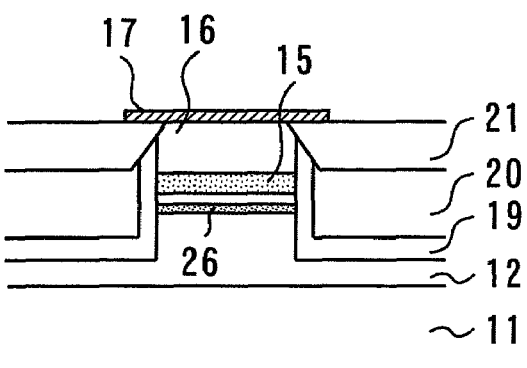
Figure 30:
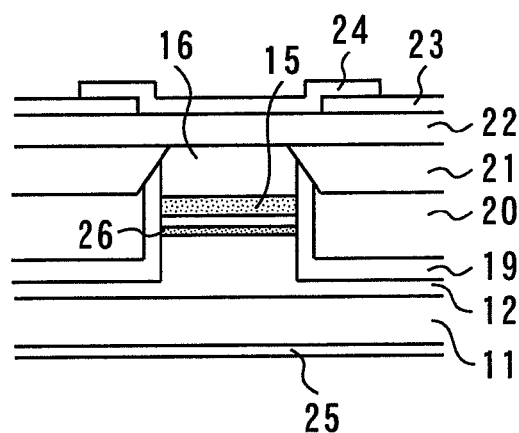
Figure 31:
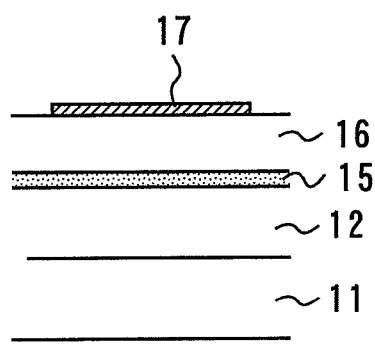
FIGS. 31-35 are sectional views for explaining a method for manufacturing a buried semiconductor optical device according to the first reference example.
Figure 32:
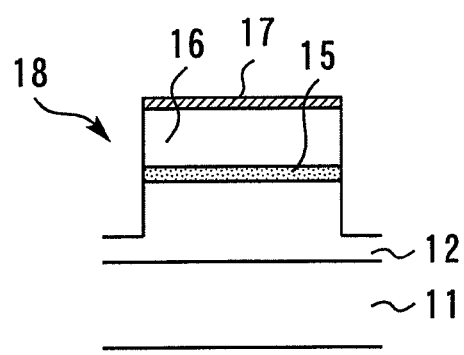
Figure 33:
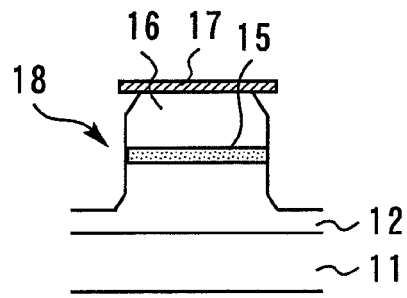
Figure 34:
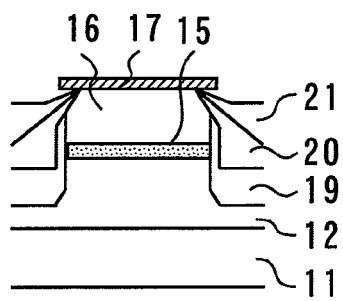
Figure 35:
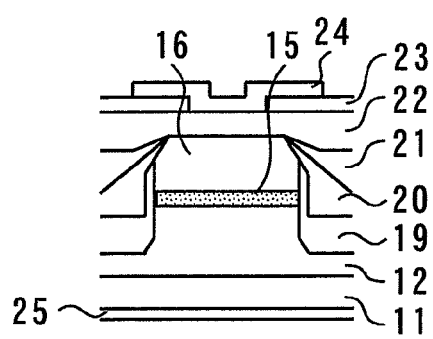
Figure 36:
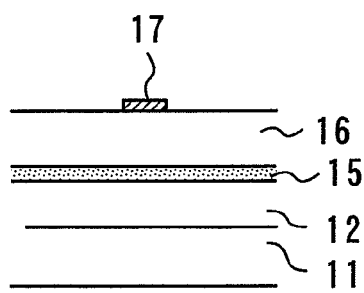
FIGS. 36-39 are sectional views for explaining a method for manufacturing a buried semiconductor optical device according to the second reference example.
Figure 37:
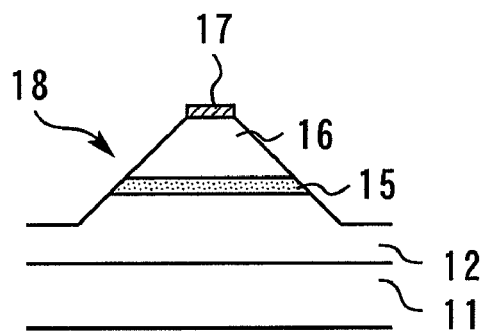
Figure 38:
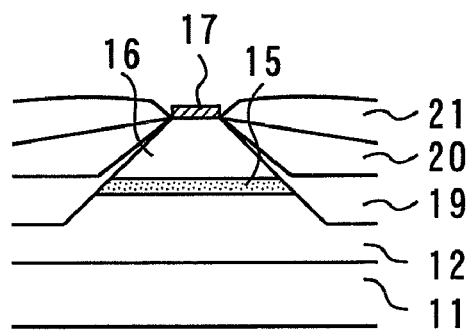
Figure 39:
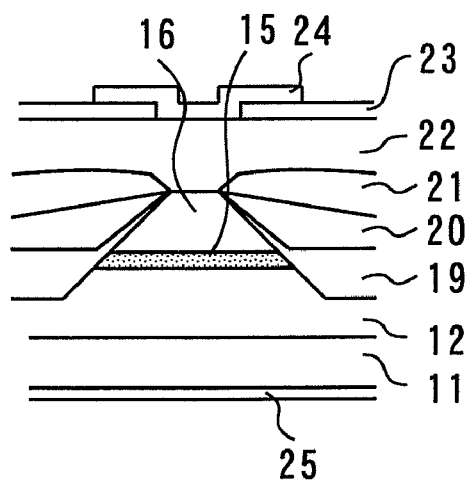

Next, as shown in FIG. 29, the striped structure 18 is buried in a p-type InP burying layer 19, an n-type InP burying layer 20, and a p-type InP burying layer 21. Then, as shown in FIG.

30, the insulating film 17 is removed, and an n-type InP layer 22, an insulating film 23, a surface electrode 24, and a back face electrode 25 are formed.

As described above, since the sixth embodiment is identical to the second embodiment except that the diffraction grating 26 is formed under the active layer 15, an equivalent effect as in the second embodiment can be achieved.

In the first to sixth embodiments, although a laminated structure formed of a p-type InP burying layer 19, an n-type InP burying layer 20, and a p-type InP burying layer 21 is used as a buried layer, the present invention is not limited thereto, but a semiconductor layer other than the InP layer, such as an AlInAs layer or a semi-insulating semiconductor layer, such as an Fe-doped InP layer may also be used. Although a p-type InP substrate 11 is used as the semiconductor substrate, the present invention is not limited thereto, but an n-InP substrate or a semi-insulating substrate may also be used. Although the case of a semiconductor laser is described as an example of a semiconductor optical device, the semiconductor optical device may be a semiconductor modulator, a semiconductor optical amplifier, or the combination thereof may also be included.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2008-021581, filed on Jan. 31, 2008 including specification, claims, drawings and summary, on which the Convention priority of the present application is based, are incorporated herein by reference in its entirety.

What is claimed is:

1. A method for manufacturing a semiconductor optical device comprising:
    forming a groove in a first semiconductor layer;
    forming a second semiconductor layer containing aluminum in said groove;
    forming a third semiconductor layer on said first semiconductor layer and said second semiconductor layer;
    forming an insulating layer on said third semiconductor layer covering the portion opposite said second semiconductor layer;
    forming a stripe-shaped structure by etching said first semiconductor layer and said third semiconductor layer without exposing said second semiconductor layer, using said insulating layer as a mask; and
    burying said striped structure with burying layers.

2. The method for manufacturing the semiconductor optical device according to claim 1, further comprising exposing sides of said second semiconductor layer by dry etching, using a halogen-containing gas in a crystal growing apparatus that is used for forming said burying layers, after forming said stripe-shaped structure and before forming said burying layers.

* * * * *